May 7, 1963 D. R. BAIRD 3,089,067

SEMICONDUCTOR DEVICE

Filed Sept. 30, 1957

INVENTOR.

Donald R. Baird

BY

R. E. Fowler

ATTORNEY

United States Patent Office 3,089,067

Patented May 7, 1963

3,089,067
SEMICONDUCTOR DEVICE

Donald R. Baird, Greensburg, Pa., assignor to General Motors Corporation, Detroit, Mich., a corporation of Delaware Filed Sept. 30, 1957, Ser. No. 686,908
3 Claims. (Cl. 317—234)

This invention relates to semiconductor devices conventionally referred to as transistors, utilized to amplify electrical voltages and currents. It further relates to a junction type transistor capable of handling large amounts of power and is an improvement over the design shown in U.S. patent application S.N. 525,010, filed July 28, 1955, in the name of Edward G. Roka and assigned to a common assignee.

It is an object in making this invention to provide a power transistor capable of handling relatively large amounts of power but still having high gain and low distortion.

It is a further object in making this invention to provide a low frequency, high power transistor.

With these and other objects in view which will become apparent as the specification proceeds, the invention will be best understood by reference to the following specification and claims and the illustrations of the accompanying drawings in which:

Figure 4:
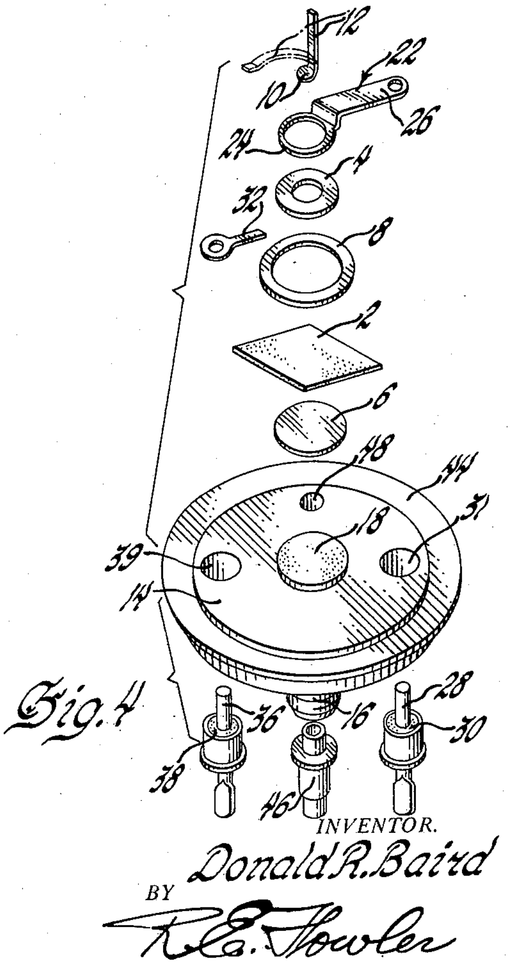
FIGURE 4 is an exploded view showing all the components of the transistor and base mount in spaced relation.

The type of transistor embodied in the current invention is known as an alloy junction transistor. It consists of a wafer of semiconductor material such for example as germanium, though other materials may be used, upon spaced areas of which there is alloyed a second material to provide sections having different electrical characteristics to produce rectifying properties. In the current instance, a germanium wafer such as shown at 2 in FIGURE 4 is utilized. To one face of the germanium wafer there is alloyed an indium ring 4 which, through the alloying process, causes a rectifying boundary to be developed within the body of the germanium wafer through penetration due to heating. The electrode formed by ring 4 is the emitter electrode of the transistor. Alloyed to the opposite face of the wafer 2 is an indium disk 6 which again through the alloying process produces a rectifying boundary within the body of the germanium wafer which is spaced from the first-named boundary. This disc 6 acts as a collector electrode of the transistor.

Having now provided an emitter and collector electrode it is last necessary to provide an ohmic connection to the germanium wafer which is known as the base electrode of the transistor. In the current instance the ohmic or base connection is provided through a conductive ring electrode 8 which surrounds but is spaced from the emitter ring 4 and is secured to the upper face of the wafer 2 by soldering. Lastly, a further second base connection is provided by having affixed at the center of the wafer a small circular conductive member 10 having an integral elongated section 12 which may be bent over in an arc when in assembled position as shown in dotted lines in FIG. 4. When all of these parts are assembled, but before the arm 12 is bent down, they form a transistor consisting of an emitter, collector and base electrode.

Figure 1:
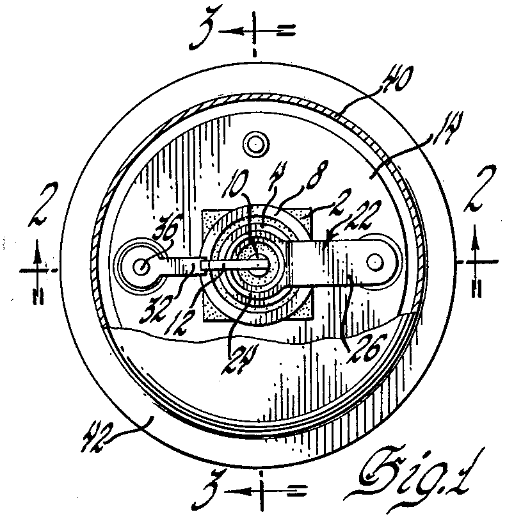
FIGURE 1 is a top plan view of a transistor embodying my invention, a portion of which is broken away and shown in section.
Figure 2:
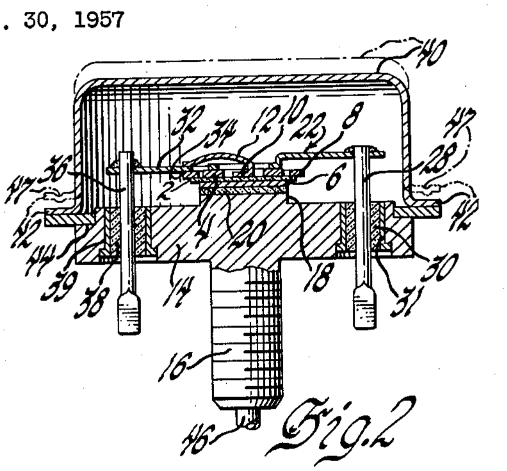
FIGURE 2 is a vertical section taken on line 2—2 of FIGURE 1.
Figure 3:
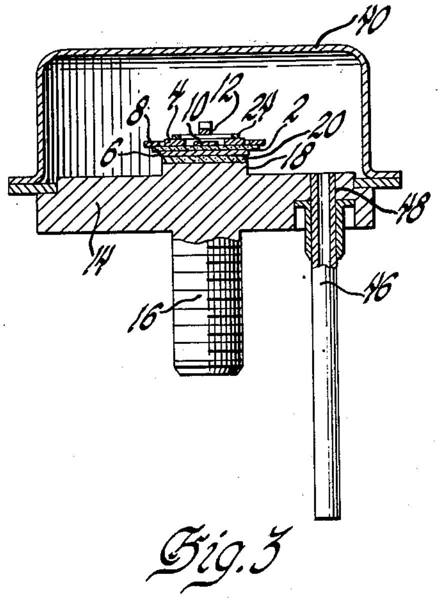
FIGURE 3 is a vertical section taken at right angles to FIGURE 2 on line 3—3 of FIGURE 1.

In order to provide suitable electrical connections to these various electrodes, and also simultaneously conduct heat away from the transistor and rectifying junctions as rapidly as possible, a heat sink or platform having good heat conducting properties is provided. This heat sink consists of a circular platform 14 upon which the transistor is adapted to be mounted and encapsulated within an evacuated chamber. The platform 14 has an integral threaded stud 16 projecting from its lower face which acts as a support for the assembled transistor when in position on a chassis. The upper face of the platform 14 has a central raised plateau section 18 of substantially the same diameter as the collector electrode 6 and to the upper surface of which said collector electrode is adapted to be secured when the device is assembled. The assembly of the transistor to the supporting heat sink is accomplished by coating the upper surface of the plateau 18 with solder as shown at 20 in FIG. 2, placing the assembled transistor thereon and then raising the temperature to the fusion point of the solder so that it will flow and secure the parts together over their complete contiguous surfaces.

After this has been accomplished, the connector 22 which includes a circular ring section 24 and an extending arm 26 is secured to the upper surface of the emitter electrode 4 by soldering and in assembled position the arm 26 extends to one side, where it may be secured to an electrode 28 mounted in a glass insulated sleeve 30 sealed in an opening 31 in the heat sink 14. Of course the connector 22 may be secured to the emitter 4 prior to the assembly of the transistor on the pedestal 18 if desired. Next, the arm 12 is bent down over the ring section 24 of the connector 22 but spaced therefrom and together with a short connector 32 is soldered to the edge of the base ring 8 as best shown at 34 in FIGURE 2. Connector 32 extends horizontally in the opposite direction to connector 26 to a position where it is secured to a second electrode 36 supported in a glass insulating sleeve or eyelet 38 sealed in a second opening 39 in the base 14. The screw thread stud support 16 therefore acts as an electrical collector connection and electrode 36 as a base connection and electrode 28 as the emitter connection.

After assembly of this much of the transistor, a cap 40 is placed over the transistor assembly so that its flanged edge 42 fits down on the peripheral surface 44 of the edge of the base. A slight ridge 47 is provided in the lower surface of the flange which holds the main flange slightly spaced from the surface of the peripheral base 44. This concentrates the electrical current when a welding current is applied across the capped base and the cap is then pressed toward the base to weld the two flat surfaces together. This forms a closed chamber around the transistor which chamber is lastly evacuated through the hollow tube 46 which extends through opening 48 in the base. When the proper vacuum has been applied to the housing, the tube 46 is sealed off. The remaining portion of the tube 46 after seal-off is also used as an indexing or locating pin for the assembly of the transistor when mounted on a chassis.

It is to be noted that the present construction utilizes a ring type emitter electrode in combination with a disk type collector electrode which is an improvement. The ring emitter together with the configuration of base electrodes shown provides an optimum geometrical arrangement to produce a minimum potential gradient between emitter and base electrodes. This permits a maximum emitter bias. The use of a disk type collector where the collector is fixedly mounted on a supporting pedestal as in this case, makes it possible to use a solid circular plateau to which the collector disk is soldered. This eliminates the necessity of a central opening under the collector which is required when a ring type collector is used and therefore any cleaning problem of such a cavity after attachment of the transistor to the heat sink.

I claim:

1. In a semiconductor device, a supporting member of good electrical and heat conducting properties having a centrally located solid raised pedestal, a transistor including a wafer of germanium having a ring-shaped electrode of indium alloyed to one face of the surface and a disk-shaped electrode of indium alloyed to the opposite face in alignment with the ring-shaped electrode, means for securing said disk-shaped electrode to the top of the pedestal so that the supporting member acts as one electrode of the transistor, a circular member secured to the periphery of the supporting member, a housing means for enclosing said transistor fitting over the same and having a ribbed flange engaging a surface of the circular member and adapted to be welded to said circular member at which time the rib is consumed and the parts sealed together.

2. In a semiconductor device, a supporting member of good electrical and heat conducting properties having a centrally located solid raised pedestal, a transistor including a wafer of germanium having a ring-shaped emitter electrode of indium alloyed to one face of the wafer and a disk-shaped collector electrode of indium alloyed to the opposite face in alignment with the ring-shaped electrode, means for securing said disk-shaped collector electrode to the top of the pedestal so that the supporting member acts as one electrode of the transistor, a base electrode having a similar configuration to the emitter electrode and spaced uniformly therefrom secured to the same face of the germanium wafer as the emitter electrode, conductors insulatedly mounted in the supporting member and electrically connected to the base and emitter electrodes, a cap housing said transistor and mounting welded to the supporting member and a hollow tube carried by the supporting member and projecting therethrough through which the interior may be evacuated and which acts as an indexing pin when sealed off.

3. In a semiconductor device, a supporting member of good electrical and heat conducting properties having a centrally located solid raised pedestal, a transistor including a wafer of germanium having a ring-shaped electrode of indium alloyed to one face of the wafer to form a first rectifying barrier within the wafer of the same general configuration and a disk-shaped electrode of indium alloyed to the opposite face in alignment with the ring-shaped electrode to form a second rectifying barrier within the wafer of disk configuration, electrically conductive members ohmically secured to the first-named face of the wafer both inside and outside the ring-shaped electrode of indium of similar configuration thereto so that the inside and outside edges of the ring-shaped electrode of indium are parallel to and spaced a short distance from the matching edges of the electrically conductive members, said electrically conductive members jointly forming the base electrode of the transistor, means for securing said disk-shaped electrode to the top of the pedestal so that the supporting member acts as one electrode of the transistor, electrical conductor means insulatably mounted in said supporting member and connected to said ring-shaped electrode to act as a lead therefor, a second electrical conductor means insulatably mounted in said supporting member and connected to both the electrically conductive members to act as a lead therefor, and housing means fitting over said transistor and sealed to said supporting member to encapsulate said transistor, electrical connections being made to the ring-shaped electrode and the disk-shaped electrode through the electrical conductor means and the supporting member respectively.

References Cited in the file of this patent

UNITED STATES PATENTS

| | | |
|---|---|---|
| 2,801,348 | Pankove | July 30, 1957 |
| 2,806,983 | Hall | Sept. 17, 1957 |
| 2,817,048 | Thuermel et al. | Dec. 17, 1957 |
| 2,847,583 | Hung | Aug. 12, 1958 |
| 2,887,628 | Zierdt | May 19, 1959 |
| 2,905,873 | Ollendorf et al. | Sept. 22, 1959 |
| 2,922,897 | Maupin | Jan. 26, 1960 |
| 2,929,972 | Roka et al. | Mar. 22, 1960 |

FOREIGN PATENTS

| | | |
|---|---|---|
| 1,141,521 | France | Mar. 18, 1957 |